United States Patent
Barrett et al.

(10) Patent No.: US 7,955,956 B2
(45) Date of Patent: Jun. 7, 2011

(54) METHOD FOR RECYCLING/RECLAIMING A MONITOR WAFER

(75) Inventors: Gary C. Barrett, Dallas, TX (US); Bradley D. Bucher, McKinney, TX (US); Colin L. Carr, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/621,393

(22) Filed: Nov. 18, 2009

(65) Prior Publication Data

US 2010/0144065 A1    Jun. 10, 2010

Related U.S. Application Data

(63) Continuation of application No. 10/885,270, filed on Jul. 6, 2004, now abandoned.

(51) Int. Cl.
*H01L 21/322* (2006.01)
*H01L 21/00* (2006.01)
*H01L 31/26* (2006.01)
*H01L 21/66* (2006.01)

(52) U.S. Cl. .................. 438/471; 438/14; 438/22; 438/4

(58) Field of Classification Search .................. 438/471, 438/14, 22, 4, 11, 12, 18
See application file for complete search history.

(56) References Cited

U.S. PATENT DOCUMENTS

| | | | |
|---|---|---|---|
| 5,502,331 A | 3/1996 | Inoue et al. | |
| 5,576,223 A * | 11/1996 | Zeininger et al. | 438/5 |
| 5,744,401 A | 4/1998 | Shirai et al. | |
| 5,817,174 A | 10/1998 | Tomita et al. | |
| 5,931,662 A | 8/1999 | Adachi et al. | |
| 6,010,797 A | 1/2000 | Tomita et al. | |
| 6,074,479 A | 6/2000 | Adachi et al. | |
| 6,146,911 A | 11/2000 | Tsuchiya et al. | |
| 6,376,395 B2 | 4/2002 | Vasat et al. | |
| 6,517,632 B2 | 2/2003 | Minami et al. | |
| 6,531,416 B1 | 3/2003 | Kobayashi et al. | |
| 6,547,647 B2 | 4/2003 | Chang | |
| 6,551,398 B2 | 4/2003 | Abe et al. | |
| 6,645,834 B2 | 11/2003 | Akiyama | |
| 6,878,645 B2 * | 4/2005 | Kobayashi et al. | 438/799 |
| 6,902,618 B2 | 6/2005 | Iida | |
| 7,008,874 B2 * | 3/2006 | Falster | 438/692 |

OTHER PUBLICATIONS

G.D. Beshkov et al., "Rapid thermal recrystallization of amorphous silicon films", Journal of Materials Research, vol. 12, No. 10, Oct. 1997, pp. 2511-2514.

* cited by examiner

*Primary Examiner* — Chuong A. Luu
(74) *Attorney, Agent, or Firm* — Warren L. Franz; Wade J. Brady, III; Frederick J. Telecky, Jr

(57) ABSTRACT

The invention provides a method for recycling/reclaiming a monitor or test wafer and a method for testing an integrated circuit manufacturing process. After a monitor wafer has been used for testing one or more semiconductor wafer processing steps to determine adequacy for use with production wafers, deposited materials and other residues from the tested processing steps are removed, and the stripped wafer is subjected to a thermal anneal to repair defects in its surface and return it to a reusable condition.

22 Claims, 1 Drawing Sheet

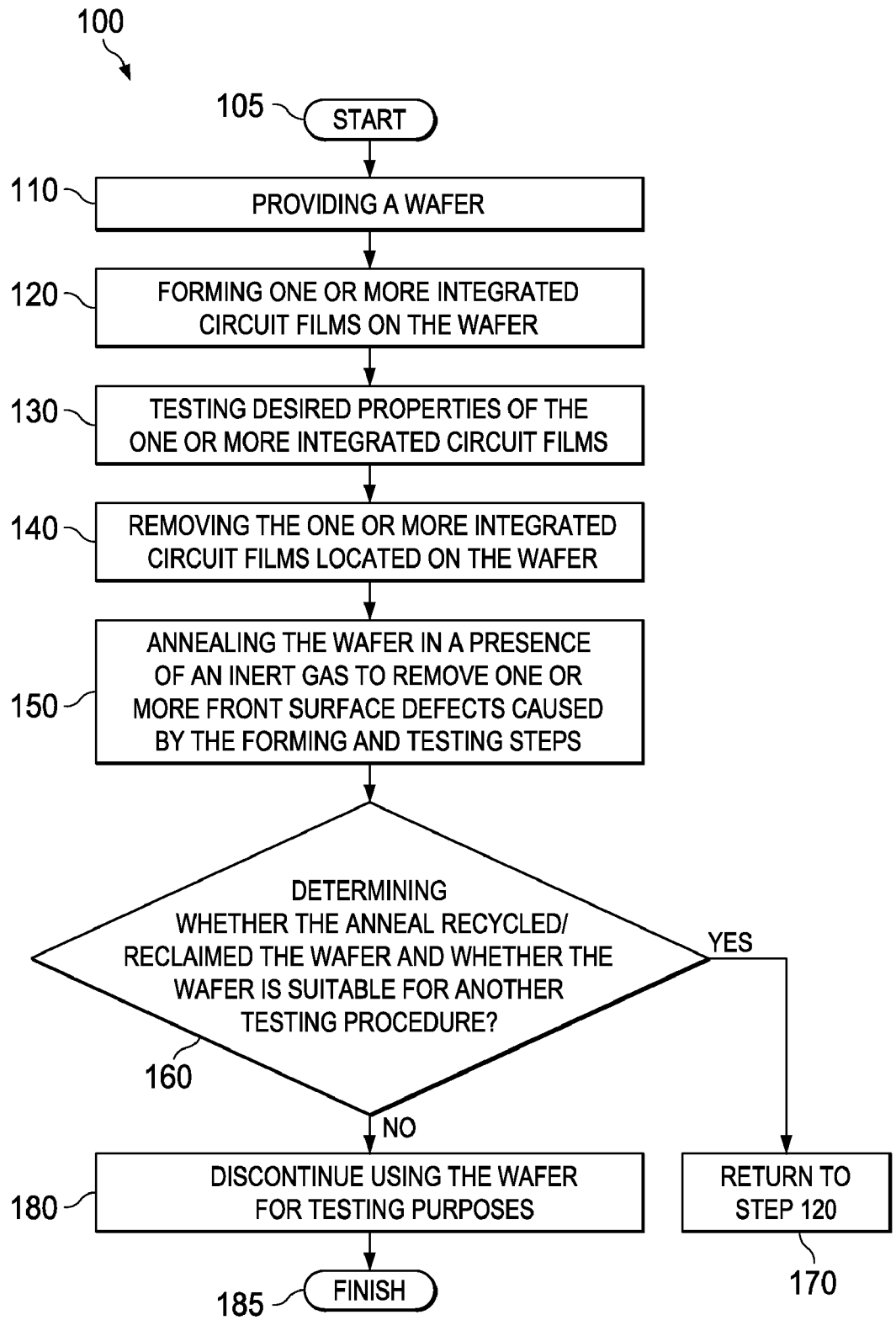

METHOD FOR RECYCLING/RECLAIMING A MONITOR WAFER

This is a continuation of U.S. application Ser. No. 10/885,270, filed Jul. 6, 2004, ABN.

BACKGROUND

The invention relates generally to the manufacture of integrated circuits and the like; and, more specifically, to the recycling/reclamation of monitor or test wafers used for testing and evaluating steps in the processing of semiconductor wafers used in such manufacturing.

In the manufacture of integrated circuits and the like, hundreds of individual manufacturing steps are required to convert a bare silicon wafer into one or more operational integrated circuits (ICs). In an effort to save time and money, after an individual manufacturing step is set up, a monitor or test wafer ("monitor wafer") is processed through the given manufacturing step to determine whether the manufacturing step achieves its intended purpose. If the specific manufacturing step being tested achieves its intended purpose, then the manufacturer is confident that actual device wafers (viz., production wafers) may be subjected to the manufacturing step. However, if the specific manufacturing step being tested does not achieve its intended purpose, the manufacturing step may be revised and tested again, without subjecting actual device wafers to the unsatisfactory manufacturing step.

The industry, as a result of the extreme number and cost of the monitor wafers being used, currently attempts to recycle or reclaim these used monitor wafers. The recycling or reclaiming of the used monitor wafers typically begins by determining what type or characteristic of used monitor wafer is being recycled or reclaimed. Knowing that information, the specific type of chemical etch, chemical strip, and/or polish that is required to return the monitor wafer to a suitable state, may be determined.

Conventional technologies do not always thoroughly restore the original condition of a monitor wafer. For example, conventional technologies may not be capable of adequately removing or reducing the number of crystal oriented pits (COPs) or oxygen induced stacking faults (OISFs) that appear on the surface of the monitor wafers, thereby failing to make them sufficiently atomically flat. OISFs typically result when oxygen precipitates out of the wafers during one or more of the multiple thermal cycles the monitor wafers experience during testing. As the COPs and OISFs show up as light point defects, similar to airborne particles, the industry generally finds them undesirable. This becomes an even greater problem as industry monitor wafer specification requirements tighten. For example, whereas industry specifications previously required about 25 particles of 0.2 microns or less per wafer, in certain instances the industry now requires less than about 25 particles of 0.16 microns or less. With the current two-step or three-step polishing processes for recycled/reclaimed wafers, COPs and other crystal oriented front surface defects are still quite abundant at the sub 0.17 micron level. If the COPs or OISFs can be removed from this count, the manufacturers' defect specifications are easier to attain.

Therefore, what is needed in the art is a method for recycling/reclaiming silicon wafers that addresses the drawbacks of the prior art processes.

SUMMARY

To address the above-discussed deficiencies of the prior art, the invention provides methods for recycling/reclaiming a monitor wafer and methods for testing a manufacturing process.

A described method for recycling/reclaiming a monitor wafer includes providing a monitor wafer having front surface defects; and annealing the monitor wafer in an inert gas to remove the front surface defects.

A described method for testing a manufacturing process includes processing a monitor wafer through a processing step used in the manufacture of an integrated circuit; testing the monitor wafer to assess the effectiveness of the processing step; annealing the monitor wafer in an inert gas to remove front surface defects left due to the processing; and recycling/reclaiming the monitor wafer for reuse.

BRIEF DESCRIPTION OF THE DRAWINGS

Additional features of the invention will become apparent from the more detailed description of example embodiments that follows, when considered in conjunction with the accompanying drawings, wherein:

FIG. 1 illustrates a flow chart of an example process flow that could be used in example implementations of recycling/reclamation and testing methods in accordance with principles of the invention.

DESCRIPTION OF EXAMPLE EMBODIMENTS

The invention recognizes that, if front surface defects caused by the tested manufacturing steps can be removed with less lapping and polishing, the effective reuse life of monitor wafers can be extended. Provided maximum surface defect specifications can be met, remaining thickness is a primary factor that determines how many times a monitor wafer can be stripped and reused. Lapping and polishing reduces wafer thickness; so providing alternative or additional defect correction or removal procedures that avoid or mitigate such thickness reduction is advantageous.

In one implementation of the principles of the invention in the recycling or monitor wafers, front surface defects created during a semiconductor wafer processing step under test (such as, e.g., during the formation of an integrated circuit film layer, or testing such film layer) are repaired/removed by annealing the surfaces of the monitor wafers in the presence of an inert gas. Accordingly, depending on the specifications of the integrated circuit (IC) manufacturer purchasing the recycled/reclaimed monitor wafers, less of the monitor wafer need be lapped or polished during refurbishing of the surface for reuse. Thus, the effective lifespan of any given monitor wafer can be increased over what it once was using the prior art etching and polishing processes. As new monitor wafers can cost upwards of $50 each, this represents a significant savings to the industry.

FIG. 1 illustrates a flow chart 100 depicting an example process flow that could be used to test a manufacturing process, that takes advantage of a recycling/reclamation method incorporating principles of the invention. Those skilled in the art will appreciate that the kind and number of steps depicted in flow chart 100 may be varied while still remaining within the scope of the invention.

The illustrated method begins after a start step 105 with the provision of a monitor or test wafer 110. The monitor wafer, which may comprise any one of a number of different types and qualities, in the embodiment of the present invention is a virgin monitor wafer. In an exemplary embodiment, the virgin monitor wafer is a wafer that was formed using the well-known Czochralski method, or a slight variation thereof. Other known or hereafter discovered manufacturing techniques could, however, also be used to form the virgin monitor wafer and remain within the scope of the present invention.

The monitor wafer will be characterized by a given set of parameters that depends on its intended use and the IC manufacturer using it. For instance, the wafer may be designed to have a certain level of electrical resistance, be doped with a certain dopant type and concentration, have a given thickness, have a given surface roughness, etc. In addition to those parameters, the initial wafer will most likely also be characterized by a maximum number of surface defects within a prescribed size limit. For instance, certain manufacturers require that the initial wafer contain less than about 25 defects of 0.2 microns or larger, or less than about 100 defects of 0.12 microns or larger, etc., when used for testing purposes.

At step 120, the monitor wafer is subjected to one or more processing steps according to a corresponding one or more processing steps prescribed for the manufacture of production ICs or the like. Such steps may include doping steps, material deposition steps, etching steps, annealing steps, or any other steps employed in semiconductor device manufacture, or combinations thereof. For the illustrated example, the monitor wafer provided at 110 is subjected at 120 to processing steps under test for the growth or deposition of one or more layers of material used in the formation of films for the manufacture of an IC or the like semiconductor device. As will be appreciated by those skilled in the art to which the invention relates, the one or more IC film layers may comprise any material formed on the wafer that might be used in the manufacture of an IC. For example, the IC film layers could be a collection of dielectric layers, conductive layers, or both. The number and type of layers will depend on the number and type of layers relevant to the specific manufacturing process step or steps being tested. The layers may be formed with or without patterning and with or without prior, subsequent or simultaneous doping.

After processing the monitor wafer through the prescribed processing steps under test, the wafer is tested at 130 to assess the effectiveness of the steps. In the illustrated case of forming one or more IC films in a prescribed manner according to semiconductor processing steps under test, the properties of the formed one or more IC films may be tested at step 130. The testing may include dissection, visual inspection and/or one or more electrical, thermal, mechanical, or other tests. Those skilled in the art will appreciate the numerous different tests and combinations of tests that might be applied to test the IC films.

Putting the monitor wafers through the prescribed processing steps, such as the illustrated formation of the IC films, and/or the subsequent testing may be a cause of one or more defects on the wafer surfaces. Front surface defects may, for example, comprise crystal oriented pits (COPs) and/or oxygen induced stacking faults (OISFs) caused by the oxygen precipitating in the wafer during thermal cycles that occurred during the formation of the IC films and/or the testing of the IC films. Other surface defects and imperfections may also occur. Even though the formation of such defects may not detrimental to testing the monitor wafer to determine the effectiveness of the tested process steps or to the determined effectiveness of the tested process steps for use on production wafers, such defects may be significant enough to require removal or repair in order to meet monitor wafer specifications for subsequent recycling and reuse of the monitor wafer for future testing purposes. For instance, both COP and OISF defects may show up as light point defects the same as do particle imperfections. As each specific IC manufacturer has a predetermined size and amount of defects per wafer, these COPs and OISFs often cause a wafer to be rejected for reuse purposes.

In a common scenario, a monitor wafer that has been subjected to the formation and testing of the one or more films may contain at least about 500 front surface defects, such as crystal oriented front surface defects, of 0.09 microns or larger. A significant portion of those will likely be COPs or OISFs. In many cases, the defects may be of a kind or number that cannot be corrected using conventional film stripping and refurbishing techniques sufficiently enough to restore the monitor wafer to a condition that meets the established maximum defect specifications necessary for reuse. Defects may also be introduced by the chemical, mechanical and/or other conventional techniques themselves that are employed to refurbish the monitor wafer after use, to strip the deposited materials and/or to otherwise try to remove the effects of the tested processing steps and transform the monitor wafer back to reusable pristine condition.

The removal of the effects on the monitor wafer left by subjecting it to the processing steps under test is indicated at step 140 in FIG. 1. For the described example of subjecting the monitor wafer to one or more film forming steps, the one or more films formed on the wafer during the prescribed steps are stripped from the wafer. The removal of the IC films may be accomplished using any of a number of different processes, or combinations of different processes. For example, the films may be subjected to single or multiple chemical etchings selective to the grown or deposited materials, followed by one or more chemical-mechanical polishing (CMP) processes. For instance, a two-step polishing process may be used, wherein the first step is a rough polish and the second step is a mirror polish.

Following the IC film removal, the stripped monitor wafer may then be subjected to one or more post-etch, post-CMP or other cleaning or repairing steps. In one embodiment, for example, the wafer may be subjected to a modified RCA chemistry. The modified RCA chemistry used may include a first SC1 solution (e.g., hydrogen peroxide, ammonium hydroxide and deionized water), followed by a second SC2 solution (e.g., hydrochloric acid, hydrogen peroxide and deionized water).

In accordance with principles of the invention, the traditional steps for removing the effects of the tested IC processing steps and returning the monitor wafer to a reusable condition are replaced, augmented and/or supplemented by one or more steps directed at removing or repairing surface defects, such as the COPs or OISFs discussed above. The addition of such defect removal steps facilitates the recycling/reclaiming process, making it easier for recovered monitor wafers to meet the test wafer maximum defect specifications requirements, thereby extending their effective reusable lifespans. The addition of such steps makes it possible in many cases to utilize less severe etching and polishing procedures, thereby alleviating some of the thinning caused thereby.

As shown in the illustrated embodiment at step 150, after removing the IC films, the stripped wafer is subjected to heat treatment or annealing to repair or remove surface defects on the monitor wafer. The annealing may be done in one or more steps, and may include heating the wafer above the recrystallization temperature for a time period sufficient to enable removal of surface crystal defects, stresses and the like. The anneal may be accomplished in the presence of an inert gas. In an example embodiment, the anneal may be accomplished in a gas that includes hydrogen, argon, another similar inert (non-reacting) gas or any combinations thereof. In another embodiment, it has been observed that deuterium, which is an isotope of hydrogen, works significantly well. The gas flow of the specific gases used may vary greatly. It is believed that a flow rate of 2000 sccm to about 50000 sccm would provide excellent results.

The anneal, which may be accomplished using a rapid thermal anneal (RTA), furnace anneal, or another similar process, may be conducted at a temperature of greater than about 1000° C. for a time period of greater than about 10 minutes for a standard furnace process or for a time period within a range extending from about 5 seconds to about 240 seconds for the RTA process. In an example embodiment, the anneal may occur at a temperature within a range extending from about 1100° C. to about 1300° C. for a time period within a range of from about 10 minutes to about 120 minutes for the standard furnace process, or a for a time period within a range extending from about 15 seconds to about 120 seconds for the rapid thermal anneal process.

The resulting stripped and annealed wafer may have less than about 100 front surface defects, such as crystal oriented front surface defects, of 0.09 microns or larger, many of those defects being particle defects rather than front surface defects. In an example embodiment, the annealed wafer has less than about 25 front surface defects of 0.09 microns or larger.

Following one or more anneal steps, the wafer may be polished (e.g., rough and/or mirror polished) or subjected to additional cleaning or other treatment steps. If, after the wafer has been annealed, its front surface has approached its original atomically flat state, so additional flattening may become unnecessary.

After annealing the wafer in step 150, the annealed wafer may be inspected at step 160 to determine whether it is suitable for another testing procedure. This inspection, as will be appreciated, might be based upon the number of defects remaining on the wafer of a certain size, the thickness of the wafer, as well as other criteria. At step 160, if it is determined that the annealing and any other wafer reconditioning steps have sufficiently restored the pre-testing condition of the wafer (e.g., the condition of the stripped wafer front surface has been returned to specification) so that the wafer will be suitable for another testing procedure, the process flow would move to step 170 where it would return to step 120. On the other hand, if it is determined that the anneal (and any other steps applied) did not adequately recycle/reclaim the wafer and that the wafer is not suitable for another testing procedure (or is not suitable for some other reason, e.g., no longer thick enough), the process flow would move to step 180, where it is retired from further recycling. Alternatively, unless unacceptable for another reason (e.g., insufficient remaining wafer thickness), the wafer could be returned to step 140 or 150 for further refurbishing. (Thickness may reduce with each reuse cycle because of successive stripping actions, so continued use is limited by the number of times a same monitor wafer has already been used for testing and the nature of the testing done.) After a wafer has been discontinued in step 180, the reuse process would finish at step 185.

Depending on the starting condition of the monitor wafer (e.g., virgin wafer vs. previously used wafer), the types of testing done, and the steps employed during the successive recovery procedures, the process illustrated in FIG. 1 could loop back to steps 120 or 140 many times (perhaps up to about 50 times) before a particular monitor wafer is determined to be unsuitable for further testing procedures. Monitor wafers whose test effects were stripped using only traditional methods (i.e., no annealing) were generally capable of reuse up to about 4 four times.

Those skilled in the art to which the invention relates will appreciate that many other embodiments and variations of the described embodiments are possible within the scope of the claimed invention.

What is claimed is:

1. A method for testing a manufacturing process, comprising:
   providing a monitor wafer;
   forming one or more integrated circuit films on the monitor wafer and testing the one or more integrated circuit films, the process of forming or testing the one or more integrated circuit films on the monitor wafer causing the monitor wafer to have a number of front surface defects thereon;
   removing the one or more integrated circuit films located on the monitor wafer; and
   after removing the one or more integrated circuit films, annealing the monitor wafer in a presence of an inert gas to correct one or more of the number of front surface defects, and thereby recycling/reclaiming the monitor wafer.

2. The method as recited in claim 1, wherein providing a monitor wafer includes providing a monitor wafer produced by a Czochralski method.

3. The method as recited in claim 1, wherein the monitor wafer provided has more than about 500 crystal oriented front surface defects of about 0.09 microns or larger, and wherein the annealed monitor wafer has less than about 100 crystal oriented front surface defects of 0.09 microns or larger.

4. The method as recited in claim 1, wherein annealing the monitor wafer includes annealing the monitor wafer using a temperature of greater than about 1000° C. for a time ranging from about 10 minutes to about 120 minutes for a standard thermal process or a time ranging from about 15 seconds to about 240 seconds for a rapid thermal anneal process.

5. The method as recited in claim 1, wherein the inert gas comprises deuterium.

6. The method as recited in claim 1, further including forming one or more integrated circuit films on the monitor wafer and then annealing the monitor wafer, up to about 50 times before discarding the monitor wafer.

7. A method for restoring the atomical flatness of a monitor wafer for recycling/reclaiming the wafer for testing of semiconductor device fabrication processes, comprising:
   providing a monitor wafer;
   processing the monitor wafer through one or more processing steps used in the manufacture of a semiconductor device including forming one or more integrated circuit films on the monitor wafer;
   testing the processed monitor wafer to assess the effectiveness of the one or more processing steps including testing the one or more integrated circuit films, the one or more processing steps or testing the one or more integrated circuit films causing the monitor wafer to have a number of front surface defects thereon;
   following the testing, removing the one or more integrated circuit films located on the monitor wafer; and
   after removing the one or more integrated circuit films, annealing the monitor wafer in a presence of an inert gas to correct one or more of the number of front surface defects, thereby restoring an atomical flatness for recycling/reclaiming the wafer.

8. The method of claim 7, wherein the step of providing the monitor wafer comprises providing the monitor wafer as a virgin monitor wafer formed using the Czochralski method.

9. The method of claim 7, wherein the step of providing the monitor wafer comprises providing the monitor wafer characterized by a given maximum number of surface defects within a prescribed size limit.

10. The method of claim 7, wherein the one or more integrated circuit films include one or more dielectric layers, conductive layers, or both, formed with or without patterning and with or without prior, subsequent or simultaneous doping.

11. The method of claim 7, wherein the front surface defects include crystal oriented pits and/or oxygen induced stacking faults.

12. The method of claim 7, wherein removing the one or more integrated circuit films includes subjecting the monitor wafer to one or more chemical and/or mechanical techniques to strip material grown or deposited on the monitor wafer in the one or more processing steps.

13. The method of claim 12, wherein the one or more chemical and/or mechanical techniques comprise single or multiple chemical etchings selective to the grown or deposited material, followed by one or more chemical-mechanical polishing processes.

14. The method of claim 13, further comprising subjecting the monitor wafer to one or more additional chemical-mechanical polishing processes following the annealing.

15. The method of claim 7, wherein the annealing comprises heating the monitor wafer above a recrystallization temperature for a time period sufficient to enable removal or surface crystal defects and stresses.

16. The method of claim 15, wherein the inert gas is deuterium flowed at a rate of 2000 to about 50000 sccm.

17. The method of claim 1, wherein:
the providing includes providing the monitor wafer characterized by a given maximum number of crystal oriented pit and oxygen induced stacking fault surface defects within a prescribed size limit;
the forming includes processing the monitor wafer through one or more processing steps for the growth or deposition of one or more layers of material used in the manufacture of a semiconductor device;
the testing includes testing the processed monitor wafer to assess the effectiveness of the one or more processing steps;
the removing includes subjecting the monitor wafer to one or more chemical etchings and/or chemical-mechanical polishing steps to strip the material grown or deposited on the monitor wafer in the one or more processing steps; and
the annealing includes, following the one or more chemical etchings and/or chemical-mechanical polishing steps, annealing the monitor wafer by heating the monitor wafer above a recrystallization temperature in an inert gas.

18. The method of claim 17, further comprising, following the annealing, inspecting the wafer to determine whether the maximum number of crystal oriented pit and oxygen induced stacking fault surface defects is still within the prescribed size limit.

19. The method of claim 18, further comprising processing the monitor wafer through other one or more processing steps used in the manufacture of a semiconductor device if the inspection determines that the maximum number of crystal oriented pit and oxygen induced stacking fault surface defects is still within the prescribed size limit.

20. The method of claim 7, wherein:
the providing includes providing the monitor wafer characterized by a given maximum number of crystal oriented pit and oxygen induced stacking fault surface defects within a prescribed size limit;
the processing includes processing the monitor wafer through one or more processing steps for the growth or deposition of one or more layers of material used in the manufacture of a semiconductor device;
the testing includes testing the processed monitor wafer to assess the effectiveness of the one or more processing steps for the growth or deposition of the one or more layers of material;
the removing includes subjecting the monitor wafer to one or more chemical etchings and/or chemical-mechanical polishing steps to strip the material grown or deposited on the monitor wafer in the one or more processing steps; and
the annealing includes, following the one or more chemical etchings and/or chemical-mechanical polishing steps, annealing the monitor wafer by heating the monitor wafer above a recrystallization temperature in an inert gas.

21. The method of claim 20, further comprising, following the annealing, inspecting the wafer to determine whether the maximum number of crystal oriented pit and oxygen induced stacking fault surface defects is still within the prescribed size limit.

22. The method of claim 21, further comprising processing the monitor wafer through other one or more processing steps used in the manufacture of a semiconductor device if the inspection determines that the maximum number of crystal oriented pit and oxygen induced stacking fault surface defects is still within the prescribed size limit.

* * * * *